(12) United States Patent
Hosokawa et al.

(10) Patent No.: US 7,709,102 B2
(45) Date of Patent: May 4, 2010

(54) ORGANIC ELECTROLUMINESCENCE DEVICE

(75) Inventors: Chishio Hosokawa, Sodegaura (JP);
Hisahiro Higashi, Sodegaura (JP);
Kenichi Fukuoka, Sodegaura (JP);
Hidetsugu Ikeda, Sodegaura (JP)

(73) Assignee: Idemitsu Kosan Co., Ltd., Tokyo (JP)

(*) Notice: Subject to any disclaimer, the term of this patent is extended or adjusted under 35 U.S.C. 154(b) by 0 days.

(21) Appl. No.: 11/169,792

(22) Filed: Jun. 30, 2005

(65) Prior Publication Data

US 2005/0238921 A1 Oct. 27, 2005

Related U.S. Application Data

(63) Continuation of application No. 10/870,997, filed on Jun. 21, 2004, now abandoned, which is a continuation of application No. 10/025,634, filed on Dec. 26, 2001, now abandoned.

(30) Foreign Application Priority Data

Dec. 26, 2000 (JP) ............................. 2000-394152

(51) Int. Cl.
*H01L 51/54* (2006.01)
(52) U.S. Cl. ....................... 428/690; 428/917; 313/504; 313/506
(58) Field of Classification Search ................. 428/690, 428/917; 313/504, 506
See application file for complete search history.

(56) References Cited

U.S. PATENT DOCUMENTS

| | | | |
|---|---|---|---|
| 5,294,810 A | 3/1994 | Egusa et al. | |
| 5,635,308 A | 6/1997 | Inoue et al. | 428/690 |
| 5,682,043 A * | 10/1997 | Pei et al. | 257/40 |
| 5,759,444 A * | 6/1998 | Enokida et al. | 252/301.16 |
| 5,776,623 A | 7/1998 | Hung et al. | 428/690 |
| 5,922,481 A * | 7/1999 | Etzbach et al. | 428/690 |
| 6,004,685 A | 12/1999 | Antoniadis et al. | |
| 6,251,531 B1 | 6/2001 | Enokida et al. | 428/690 |
| 6,392,250 B1 | 5/2002 | Aziz et al. | 257/40 |
| 6,534,199 B1 | 3/2003 | Hosokawa et al. | 428/690 |

FOREIGN PATENT DOCUMENTS

| | | | |
|---|---|---|---|
| EP | 0 468 438 A2 | | 1/1992 |
| EP | 1063869 | * | 12/2000 |
| JP | 04-212286 | | 8/1992 |
| JP | 04-334894 | | 11/1992 |
| JP | 8-53397 | | 2/1996 |
| JP | 08-208745 | | 8/1996 |
| JP | 09-053068 | | 2/1997 |
| JP | 9-87616 | | 3/1997 |
| JP | 11-003782 | | 1/1999 |
| JP | 11-8068 | | 1/1999 |
| JP | 11-265788 | | 9/1999 |
| JP | 11-307255 | | 11/1999 |
| JP | 2000-133453 | | 5/2000 |
| JP | 2000-344691 | | 12/2000 |
| WO | WO 00/41443 | * | 7/2000 |

OTHER PUBLICATIONS

Machine-generated English Translation for JP 11-265788, published Sep. 1999.*
Shaheen, S.E., et al., "Energy and charge transfer in organic light-emitting diodes: A soluble quinacridone study", Journal of Applied Physics, American Institute of Physics, New York, US, vol. 85, No. 11, Jun. 1, 1999, pp. 79397945.
Hamada, Yuji, et al., "Red organic light-emitting diodes using an emitting assist dopant", Applied Physics Letters, AIP, American Institute of Physics, Melville, NY, US, vol. 75, No. 12, Sep. 20, 1999, pp. 1682-1684.
Aminaka, E. et al, "Electroluminescent Behaviors in Multilayer Thin-Film Electroluminescent Devices Using 9,10-Bis-styrylanthracene Derivatives," Jpn. J. Appl. Phys., vol. 33 (1994), pp. 1061-1068.

* cited by examiner

*Primary Examiner*—Dawn Garrett
(74) *Attorney, Agent, or Firm*—Steptoe & Johnson LLP

(57) ABSTRACT

An organic electroluminescence device comprising a pair of electrodes and a layer of an organic light emitting medium disposed between the pair of electrodes, wherein the layer of an organic light emitting medium comprises a mixed layer comprising (A) at least one hole transporting compound and (B) at least one electron transporting compound, an energy gap of the hole transporting compound represented by Eg1 and an energy gap of the electron transporting compound represented by Eg2 satisfy a relation: Eg1<Eg2. Electrons and holes are recombined in the layer of an organic light emitting medium and light is emitted. The organic electroluminescence device has a long life and emits light at a high efficiency.

16 Claims, No Drawings

ORGANIC ELECTROLUMINESCENCE DEVICE

REFERENCE TO RELATED APPLICATIONS

This application is a continuation of application Ser. No. 10/870,997, filed Jun. 21, 2004 now abandoned, which was a continuation of application Ser. No. 10/025,634, Dec. 26, 2001 now abandoned.

TECHNICAL FIELD

The present invention relates to an organic electroluminescence device (hereinafter, "electroluminescence" will be referred to as EL) and, more particularly, to an organic EL device having a long life and emitting light at a high efficiency.

BACKGROUND ART

EL devices which utilize light emission under application of an electric field show high self-distinguishability due to the self-emission and exhibit excellent impact resistance since they are completely solid devices. Therefore, EL devices have been attracting attention for application as light emitting devices in various types of display apparatus.

The EL devices include inorganic EL devices in which an inorganic compound is used as the light emitting material and organic EL devices in which an organic compound is used as the light emitting material. Organic EL devices have been extensively studied for practical application as a light emitting device of the next generation because the applied voltage can be decreased to a great extent, the size of the device can be reduced easily, consumption of electric power is small, planar light emission is possible and three primary colors are easily emitted.

As for the construction of the organic EL device, the basic construction comprises an anode/an organic light emitting layer/a cathode. Constructions having a hole injecting and transporting layer or an electron injecting layer suitably added to the basic construction are known. Examples of such constructions include the construction of an anode/a hole injecting and transporting layer/an organic light emitting layer/a cathode and the construction of an anode/a hole injecting and transporting layer/an organic light emitting layer/an electron injecting layer/a cathode.

In the development of organic EL devices which can be practically applied, various studies to obtain a light emitting element having a long life and emits light at a high efficiency have been conducted. However, an element having a longer life and emits light at a higher efficiency is desired so that consumption of electric power can be further reduced.

For example, in International Patent Application Laid-Open No. 98/08360 and U.S. Pat. No. 5,853,905, elements in which a mixed layer of an amine derivative having the electron transporting property and an energy gap of 3 eV or greater and an aluminum complex of 8-hydroxyquinoline (Alq) as an electron transporting compound is used as the light emitting medium are disclosed. Since the energy gap of Alq is 2.7 eV, holes and electrons are recombined in Alq having a lower energy gap and light is emitted in this light emitting medium. Since Alq itself has a small quantum yield of fluorescence, the efficiency is enhanced by adding a light emitting dopant such as coumarine and rubrene.

However, the technology disclosed in the above references has a drawback in that the life of the device cannot be increased to the desired value. In other words, in general, few organic materials which simultaneously achieve excellent transportation of electrons and excellent durability under an electric current can be found. It is confirmed that Alq is degraded when holes are injected into Alq although Alq exhibits excellent durability in transportation of electrons. In the case of the above light emitting medium, the energy gap of the hole transporting compound $Eg1$ and the energy gap of the electron transporting compound $Eg2$ has the relation: $Eg1 > Eg2$. Therefore, holes tend to be injected into Alq having a smaller energy gap and the life of the device cannot be increased to the desired value. Although it is known that durability of Alq can be improved by addition of a light emitting dopant such as coumarine and rubrene, further improvement has been desired.

DISCLOSURE OF THE INVENTION

Under the above circumstances, the present invention has an object of providing an organic EL device which has a longer life and emits light at a higher efficiency than those of conventional organic EL devices.

As the result of intensive studies by the present inventors to achieve the above object, it was found that an organic EL device having a longer life and emitting light at a higher efficiency than those of conventional organic EL devices could be obtained when an organic electroluminescence device comprising a layer of an organic light emitting medium comprised a mixed layer comprising (A) at least one hole transporting compound and (B) at least one electron transporting compound and an energy gap of the hole transporting compound represented by $Eg1$ was smaller than an energy gap of the electron transporting compound represented by $Eg2$. The present invention has been completed based on the knowledge.

The present invention provides an organic electroluminescence device comprising a pair of electrodes and a layer of an organic light emitting medium disposed between the pair of electrodes, wherein the layer of an organic light emitting medium comprises a mixed layer comprising (A) at least one compound selected from hole transporting compounds and (B) at least one compound selected from electron transporting compounds and an energy gap of the hole transporting compound represented by $Eg1$ and an energy gap of the electron transporting compound represented by $Eg2$ satisfy a relation: $Eg1 < Eg2$.

THE MOST PREFERRED EMBODIMENT TO CARRY OUT THE INVENTION

The present invention provides an organic electroluminescence device comprising a pair of electrodes and a layer of an organic light emitting medium disposed between the pair of electrodes, wherein the layer of an organic light emitting medium comprises a mixed layer comprising (A) at least one compound selected from hole transporting compounds and (B) at least one compound selected from electron transporting compounds and an energy gap of the hole transporting compound represented by $Eg1$ and an energy gap of the electron transporting compound represented by $Eg2$ satisfy a relation: $Eg1 < Eg2$.

Due to this relation in the layer of an organic light emitting medium, holes are transported with the hole transporting compound and electrons are injected into the hole transporting compound in the area of recombination. Light is emitted by recombination of the holes and the electrons. Since injection of holes into the electron transporting compound is suppressed, degradation of the electron transporting compound is suppressed and the life of the device is extended. The hole transporting compound can also provide durability to the electron injection.

It is preferable that the ionization energy of the hole transporting compound represented by IP1 and the ionization energy of the electron transporting compound represented by IP2 satisfy the relation: IP1≦P2.

Due to this relation, holes are more easily injected into the lowest occupied orbital of the hole transporting compound from an outer layer of the light emitting medium. The outer layer means a layer other than the layer of the light emitting medium such as the anode, a hole injecting layer, a hole transporting layer and a buffer layer.

It is preferable that the electron affinity of the hole transporting compound represented by Af1 and the electron affinity of the electron transporting compound represented by Af2 satisfy a relation: Af1≦Af2. The electron affinities represented by Af1 and Af2 are values of the energies of the lowest vacant orbitals based on the energy level of an electron in the vacuum as the reference. Due to this relation, electrons are more easily injected into the lowest vacant orbital of the electron transporting compound from an outer layer of the layer of the light emitting medium. The outer layer means a layer other than the layer of the light emitting medium such as the cathode, an electron injecting layer, an electron transporting layer, a hole arresting layer or a buffer layer. In this case, it is preferable that ΔEv given by ΔEv=IP2−IP1 and ΔEc given by ΔEc=Af2−AF1 satisfy a relation: ΔEv≧ΔEc. Due to this relation, electrons are more easily injected into the lowest vacant orbital of the hole transporting compound through the electron transporting compound. On the other hand, injection of holes into the lowest vacant orbital of the electron injecting compound is suppressed.

The electron affinity of the hole transporting compound represented by Af1 and the electron affinity of the electron transporting compound represented by Af2 may satisfy a relation: Af1>Af2. In this case, the hole transporting compound does not substantially transport electrons or the mobility of electrons with the hole transporting compound is smaller than the mobility of electrons with the electron transporting compound. In this the mobility of electrons with the electron transporting compound. In this case, it is preferable that ΔEv given by ΔEv=IP2−IP1 and ΔEc' given by ΔEc'=Af1−AF2 satisfy a relation: ΔEv≧ΔEc'. Due to this relation, the trapping effect of the hole transporting compound decreases and electrons transported with the electron transporting compound can more easily reach the area of recombination.

It is preferable that the hole transporting compound used in the organic EL device of the present invention is an aromatic amine having a condensed cyclic structure.

It is preferable that the aromatic amine is represented by the following general formula (1):

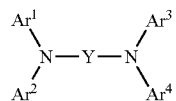

(1)

wherein Ar¹ to Ar⁴ each independently represent a substituted or unsubstituted aromatic hydrocarbon group having 6 to 40 carbon atoms or a substituted or unsubstituted aromatic heterocyclic group having 3 to 40 carbon atoms, Y represents a substituted or unsubstituted aromatic residue group having 2 to 60 carbon atoms, at least one of the groups represented by Ar¹ to Ar⁴ and Y has a condensed cyclic group having 3 or more rings and a substituent in the groups represented by Ar¹ to Ar⁴ and Y may form a ring with two groups selected from the groups represented by Ar¹ to Ar⁴ and Y; or by the following general formula (2):

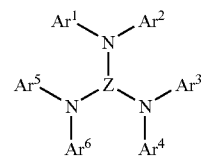

(2)

wherein Ar¹ to Ar⁶ each independently represent a substituted or unsubstituted aromatic hydrocarbon group having 6 to 40 carbon atoms or a substituted or unsubstituted aromatic heterocyclic group having 3 to 40 carbon atoms, Z represents a substituted or unsubstituted aromatic residue group having 3 to 60 carbon atoms, at least one of the groups represented by Ar¹ to Ar⁶ and Z has a condensed cyclic group having 3 or more rings and a substituent in the groups represented by Ar¹ to Ar⁶ and Z may form a ring with two groups selected from the groups represented by Ar¹ to Ar⁶ and Z.

In the above general formulae (1) and (2), examples of the groups represented by Ar¹ to Ar⁶, Y and Z include aromatic residue groups derived from anthracene, chrysene, fluorene, pyrene, perylene, naphthalene, pentacene, coronene, fluoranthene, pycene, rubicene and acenaphtho-fluoranthene.

It is preferable that the compounds represented by general formulae (1) and (2) are compounds represented by any of the following general formulae (7) to (11).

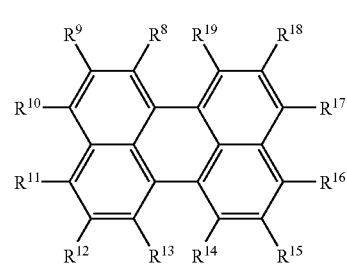

(7)

In the above general formula (7), R⁸ to R¹⁹ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 3 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 40 carbon atoms or carboxyl group. Two groups selected from the groups represented by R⁸ to R¹⁹ may form a ring and at least one of the groups represented by R⁸ to R¹⁹ is a diarylamino group represented by —NAr⁷Ar⁸. Ar⁷ and Ar⁸ each independently represent a substituted or unsubstituted aryl group having 6 to 20 carbon atoms.

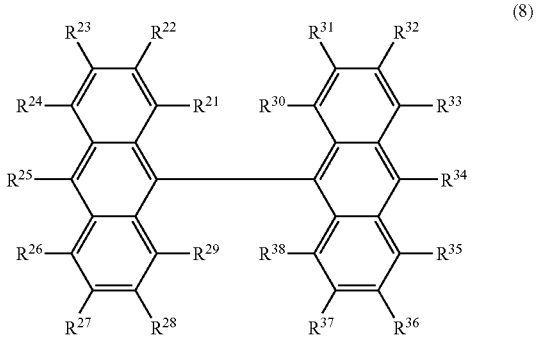
(8)

In the above general formula (8), $R^{21}$ to $R^{38}$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 3 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 40 carbon atoms or carboxyl group. Two groups selected from the groups represented by $R^{21}$ to $R^{38}$ may form a ring and at least one of the groups represented by $R^{21}$ to $R^{38}$ is a diarylamino group represented by —$NAr^7Ar^8$. $Ar^7$ and $Ar^8$ each independently represent a substituted or unsubstituted aryl group having 6 to 20 carbon atoms.

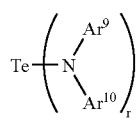
(9)

In the above general formula (9), Te represents a terylene residue group, $Ar^9$ and $Ar^{10}$ each independently represent a substituted or unsubstituted alkyl group having 1 to 30 carbon atoms, a substituted or unsubstituted monocyclic group or a substituted or unsubstituted condensed polycyclic group having 6 to 40 carbon atoms and r represents an integer of 1 to 6.

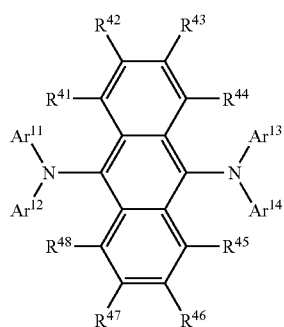
(10)

In the above general formula (10), $Ar^{11}$ to $Ar^{14}$ each independently represent a substituted or unsubstituted aryl group having 6 to 16 carbon atoms and $R^{41}$ to $R^{48}$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 3 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 40 carbon atoms or carboxyl group and two groups selected from the groups represented by $R^{41}$ to $R^{48}$ may form a ring.

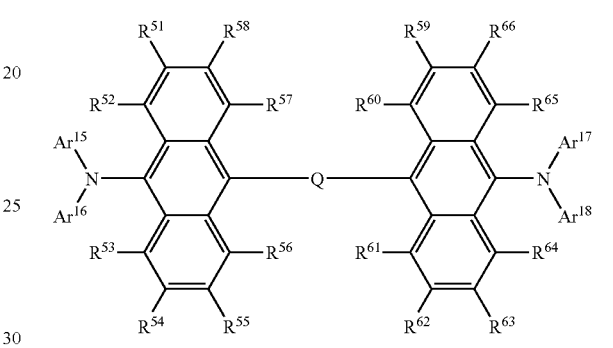
(11)

In the above general formula (11), $Ar^{15}$ to $Ar^{18}$ each independently represent a substituted or unsubstituted alkyl group having 1 to 30 carbon atoms, a substituted or unsubstituted monocyclic group, a substituted or unsubstituted condensed polycyclic group having 8 to 40 carbon atoms; an integral combination of $Ar^{15}$ and $Ar^{16}$ and an integral combination of $Ar^{17}$ and $Ar^{18}$ each represent a condensed polycyclic group having a nitrogen atom as a bonding atom; Q represents a divalent bonding group bonding a cyclic group or a plurality of cyclic groups and may be substituted or unsubstituted; $R^{51}$ to $R^{66}$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 3 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 40 carbon atoms or carboxyl group; and two groups selected from the groups represented by $R^{51}$ to $R^{66}$ may form a ring.

The aromatic amine compound, the aromatic diamine compound and the aromatic triamine compound used in the present invention are compounds having structures represented by the above general formulae (1), (2) and (7) to (11). In each general formula, preferable examples of the substituent include halogen atoms, hydroxyl group, substituted and unsubstituted amino groups, nitro group, cyano group, substituted and unsubstituted alkyl groups, substituted and unsubstituted alkenyl groups, substituted and unsubstituted cycloalkyl groups, substituted and unsubstituted alkoxyl groups, substituted and unsubstituted aromatic hydrocarbon groups, substituted and unsubstituted aromatic heterocyclic groups, substituted and unsubstituted aralkyl groups, substituted and unsubstituted aryl groups, substituted and unsubstituted aryloxyl groups, substituted or unsubstituted alkoxycarbonyl groups and carboxyl group.

Examples of the substituted and unsubstituted alkyl groups include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted and unsubstituted alkenyl groups include vinyl group, allyl group, 1-butenyl group, 2-butenyl group, 3-butenyl group, 1,3-butadienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl, group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted and unsubstituted cycloalkyl groups include cyclopropyl group, cyclobutyl group, cyclopentyl group, cyclohexyl group and 4-methylcyclohexyl group.

The substituted and unsubstituted alkoxyl groups are represented by —OY$^1$. Examples of the group represented by Y$^1$ include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted and unsubstituted aromatic hydrocarbon groups include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylpheny group, p-(2-phenylpropyl)phenyl group, 3-methyl-2-naphthyl group, 4-methyl-1-naphthyl group, 4-methyl-1-anthryl group, 4'-methylbiphenylyl group and 4'-t-butyl-p-terphenyl-4-yl group.

Examples of the substituted and unsubstituted aromatic heterocyclic groups include 1-pyrrolyl group, 2-pyrrolyl group, 3-pyrrolyl group, pyradinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, phenanthrolyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methyl-pyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the substituted and unsubstituted aralkyl groups include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthyl-isopropyl group, 2-α-naphthylisopropyl group, 13-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

Examples of the substituted and unsubstituted aryl groups include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylpheny group, p-(2-phenylpropyl)phenyl group, 3-methyl-2-naphthyl group, 4-methyl-1-naphthyl group, 4-methyl-1-anthryl group, 4'-methylbiphenylyl group, 4''-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindoiyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 1-acridinyl group, 2-acridinyl group, 3-acridinyl group, 4-acridinyl group, 9-acridinyl group, phenanthrolyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The substituted and unsubstituted aryloxy groups are represented by —$OZ^1$. Examples of the group represented by $Z^1$ include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylpheny group, p-(2-phenylpropyl)phenyl group, 3-methyl-2-naphthyl group, 4-methyl-1-naphthyl group, 4-methyl-1-anthryl group, 4'-methylbiphenylyl group, 4''-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindoiyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 1-acridinyl group, 2-acridinyl group, 3-acridinyl group, 4-acridinyl group, 9-acridinyl group, phenanthrolyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The substituted and unsubstituted alkoxycarbonyl groups are represented by —$COOY^2$. Examples of the group represented by $Y^2$ include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

It is preferable that the electron transporting compound used in the organic EL device of the present invention is a heterocyclic compound having a nitrogen atom or a complex having a nitrogen atom and more preferably a complex having a nitrogen atom. The heterocyclic compound having a nitrogen atom and the complex having a nitrogen atom are preferable since these compounds have electron affinities as great as 2.7 eV or greater and mobilities of electrons as great as $1 \times 10^{-6}$ cm$^2$/V·S or greater.

Examples of the heterocyclic compound having a nitrogen atom include oxadiazole derivatives such as 2-(4-biphenylyl)-5-(4-tert-butyl-phenyl)-1,3,4-oxadiazole and bis[2-(4-tert-butyl-phenyl)-1,3,4-oxadiazole]-m-phenylene, triazole derivatives and quinoxalinequinoline derivatives.

It is preferable that the complex having a nitrogen atom is represented by the following general formula (3):

$$M\text{-}A_mB_n \quad (3)$$

wherein M represents a monovalent to trivalent metal, A represents a ligand having a nitrogen atom, B represents a ligand having no nitrogen atoms, m represents an integer of 1 to 4, n represents an integer of 0 to 2 and integers represented by m and n satisfy m+n≦4.

Examples of the metal represented by M include Li, Na, Cs, Be, Mg, Ca, Ba, Zn, Cd, Al, Ga, In and Yb. Among these metals, Al, Be and Ga are preferable.

Examples of the ligand represented by A include ligands based on quinolinol and ligands based on benzoquinolinol.

Examples of the complex having a nitrogen atom include complexes represented by the following general formulae (i) to (iii):

(i) M$^+$A or M$^+$A' (M$^+$ representing a monovalent metal ion)
(ii) M$^{2+}$A$_2$, M$^{2+}$AA' or M$^{2+}$A'$_2$ (M$^{2+}$ representing a divalent metal ion)
(iii) M$^{3+}$A$_3$, M$^{3+}$A$_2$A', M$^{3+}$AA'$_2$ or M$^{3+}$A'$_3$ (M$^{3+}$ representing a trivalent metal ion)

Examples of the ligands represented by A and A' include ligands represented by the following general formula (iv). The ligands represented by A and A' may the same with or different from each other. Substituents in the ligands represented by A and A' may be the same with or different from each other. Examples of the substituent include alkyl groups, alkoxyl groups, aryloxyl groups and aryl groups.

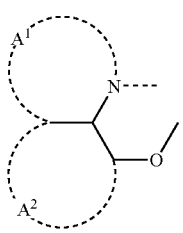

(iv)

In the above general formula (iv), A$^1$ and A$^2$ each independently represent a substituted or unsubstituted aromatic cyclic structure and may represent the same structure or different structures.

Further examples of the ligands represented by A and A' include ligands represented by the following general formulae:

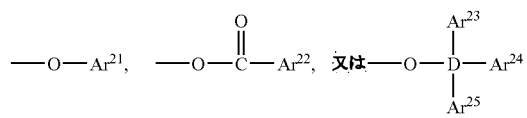

In the above formulae, D represents an atom selected from Si, Ge and Sn and Ar$^{21}$ to Ar$^{25}$ each independently represent an aromatic hydrocarbon group or an aromatic heterocyclic group which may have substituents.

Further examples of the ligands represented by A and A' include benzoazoles such as derivatives of benzimidazole, benzothiazole and benzoxazole.

Among the above ligands having a nitrogen atom which are represented by A and A', ligands represented by the following general formula (4) are preferable:

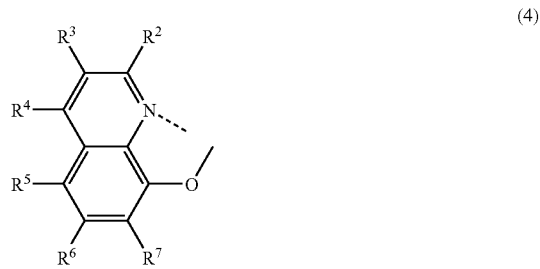

(4)

wherein R$^2$ to R$^7$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 3 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 40 carbon atoms or carboxyl group and two groups selected from the groups represented by R$^2$ to R$^7$ may form a ring.

Examples of the complex having ligands having a nitrogen atom as the complex having a nitrogen atom include complexes having ligands having a nitrogen atom which are derived from 8-quinolinol or derivative thereof such as tris(8-quinolinolato)aluminum, bis(8-quinolinolato)magnesium, bis-(benzo(f)-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-methyl-8-quinolinolato)gallium, bis(5-chloro-8-quinolinolato)calcium, 5,7-dichloro-8-8-quinilinolatoaluminum, tris(5,7-dibromo-8-hydroxyquinolinolato)aluminum and poly[zinc(II)-bis(8-hydroxy-5-quinolinyl)methane].

Examples of the complex having a ligand having a nitrogen atom and a ligand having no nitrogen atoms include bis(2-methyl-8-quinolinolato)(phenolato)aluminum(III), bis(2-methyl-8-quinolinolato)(ortho-cresolato)aluminum(II), bis(2-methyl-8-quinolinolato)(metacresolato)aluminum(III), bis(2-methyl-8-quinolinolato)(para-cresolato)aluminum(III), bis(2-methyl-8-quinolinolato)(ortho-phenylphenolato)aluminum(III), bis(2-methyl-8-quinolinolato)(meta-phenylphenolato)aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum(III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato) aluminum (III), bis(2-methyl-8-quinolinolato)(2,6-diphenylphenolato)aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis(2-methyl-8-quinolinolato)(2,3,5,6-tetramethylphenolato)aluminum(III), bis(2-methyl-8-quinolinolato)(3-naphtholato)aluminum(III), bis(2-methyl-8-quinolinolato)(2-naphtholato)aluminum(III), bis(2,4-dimethyl-8-quinolinolato)(2-naphtholato)aluminum(III), bis(2,4-dimethyl-8-quinolinolato)(para-phenylphenolato)aluminum(II), bis(2,4-dimethyl-8-quinolinolato)(meta-phenylphenolato)aluminum(III), bis(2,4-dimethyl-8-quinolinolato)(3,5-dimethylphenolato)aluminum(III), bis(2,4-dimethyl-8-quinolinolato)(3,5-di-tert-butylphenolato) aluminum(III), bis(2-methyl-4-ethyl-8-quinolinolato)(para-cresolato)aluminum(III), bis(2-methyl-4-methoxy-8-quinolinolato)(para-phenylphenolato)aluminum(III), bis(2-methyl-5-cyano-8-quinolinolato)(ortho-cresolato)aluminum(III), bis(2-methyl-6-trifluoromethyl-8-quinolinolato)(2-naphtholato)aluminum(III), bis(2-methyl-8-quinolinolato)aluminum(III)-μ-oxo-bis(2-methyl-8-quinolinolato)-aluminum(III), bis(2,4-dimethyl-8-quinolinolato)-aluminum(III)-μ-oxo-bis(2,4-dimethyl-8-quinolinolato)aluminum(III), bis(4-ethyl-2-methyl-8-quinolinolato)aluminum(III)-μ-oxo-bis(4-ethyl-2-methyl-8-quinolinolato)-aluminum(III), bis(2-methyl-4-methoxyquinolinolato)-aluminum(III)-μ-oxo-bis(2-methyl-4-methoxyquinolinolato)aluminum(III), bis(5-cyano-2-methyl-8-quinolinolato)aluminum(III)-μ-oxo-bis(5-cyano-2-methyl-8-quinolinolato)aluminum(III) and bis(2-methyl-5-trifluoromethyl-8-quinolinolato)aluminum(III)-μ-oxo-bis(2-methyl-5-trifluoromethyl-8-quinolinolato)aluminum(III).

The electron transporting compound used in the organic EL device of the present invention may be an anthracene derivative represented by the following general formula (5):

$$A^1\text{-}L\text{-}A^2 \quad (5)$$

wherein $A^1$ and $A^2$ each independently represent a substituted or unsubstituted monophenylanthryl group or a substituted or unsubstituted diphenylanthryl group and may represent the same group or different groups and L represents a single bond or a divalent bonding group; or by the following general formula (6):

$$A^3\text{-}An\text{-}A^4 \quad (6)$$

wherein An represents a substituted or unsubstituted anthracene residue group and $A^3$ and $A^4$ each independently represent a substituted or unsubstituted monovalent condensed aromatic cyclic group having 10 to 40 carbon atoms or a substituted or unsubstituted aryl group having no condensed cyclic structures and having 12 to 40 carbon atoms and may represent the same group or different groups.

Examples of the substituent in general formulae (5) and (6) include alkyl groups having 1 to 6 carbon atoms, cycloalkyl groups having 3 to 6 carbon atoms, alkoxyl groups having 1 to 6 carbon atoms, aryloxyl groups having 5 to 18 carbon atoms, aralkyloxyl groups having 7 to 18 carbon atoms, amino groups substituted with aryl groups having 5 to 16 carbon atoms, nitro group, cyano group, ester groups having 1 to 6 carbon atoms, halogen atoms and alkenyl groups.

Examples of the alkyl group having 1 to 6 carbon atoms include methyl group, ethyl group, propyl group, isopropyl group, butyl group, isobutyl group, sec-butyl group, tert-butyl group, various types of pentyl groups and various types of hexyl groups.

Examples of the cycloalkyl group having 3 to 6 carbon atoms include cyclopropyl group, cyclobutyl group, cyclopentyl group and cyclohexyl group.

Examples of the alkoxyl group having 1 to 6 carbon atoms include methoxyl group, ethoxyl group, propoxyl group, isopropoxyl group, butoxyl group, isobutoxyl group, sec-butoxyl group, tert-butoxyl group, various types of pentyloxyl groups and various types of hexyloxyl groups.

Examples of the aryloxyl group having 5 to 18 carbon atoms include phenoxyl group, tolyloxyl group and naphthyloxyl group.

Examples of the aralkyloxyl group having 7 to 18 carbon atoms include benzyloxyl group, phenetyloxyl group and naphthylmethoxyl group.

Examples of the amino group substituted with an aryl group having 5 to 16 carbon atoms include diphenylamino group, ditolylamino group, dinaphthylamino group and naphthylphenylamino group.

Examples of the ester group having 1 to 6 carbon atoms include methoxycarbonyl group, ethoxycarbonyl group, propoxycarbonyl group and isopropoxycarbonyl group.

Examples of the halogen atom include fluorine atom, chlorine atom and bromine atom.

Examples of the aryl group include styrylphenyl group, styrylbiphenyl group and styrylnaphthyl group.

Preferable examples of the anthracene derivative represented by general formula (5) include anthracene derivatives represented by general formula (5-a):

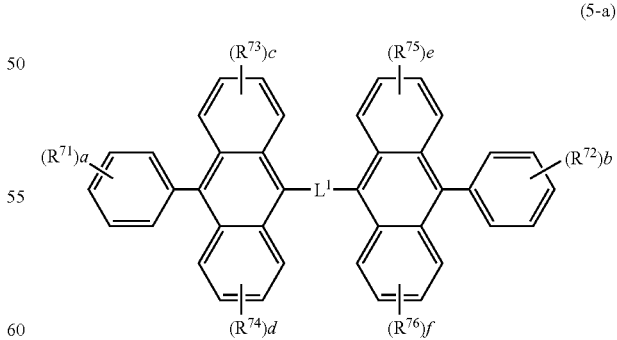

wherein $R^{71}$ to $R^{76}$ each independently represent an alkyl group, a cycloalkyl group, an alkenyl group, a substituted or unsubstituted aryl group, an alkoxyl group, an aryloxyl group, an alkylamino group, an arylamino group or a substituted or unsubstituted heterocyclic group; a and b each represent an integer of 0 to 5; c, d, e and f each represent an integer of 0 to 4; when any of a to f represents an integer of 2 or greater, a plurality of groups represented by the corresponding $R^{71}$, $R^{72}$, $R^{73}$, $R^{74}$, $R^{75}$ or $R^{76}$ may be the same with or different from each other and may form a ring by forming a bond between each other; and $L^1$ represents a single bond, —O—, —S—, —N(R)— or an arylene group, R representing an alkyl group or a substituted or unsubstituted aryl group; and anthracene derivatives represented by general formula (5-b):

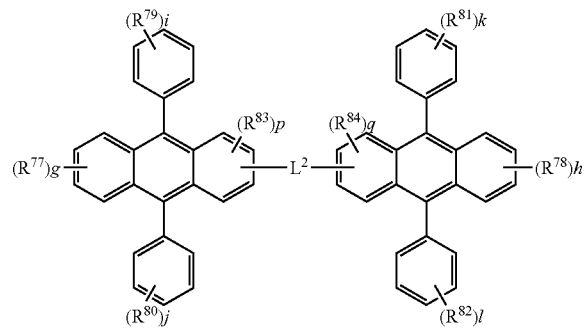

(5-b)

wherein $R^{77}$ to $R^{84}$ each independently represent an alkyl group, a cycloalkyl group, an alkenyl group, a substituted or unsubstituted aryl group, an alkoxyl group, an aryloxyl group, an alkylamino group, an arylamino group or a substituted or unsubstituted heterocyclic group; g and h each represent an integer of 0 to 4; i, j, k and l each represent an integer of 0 to 5; p and q each represent an integer of 0 to 3; when any of g to l represents an integer of 2 or greater, a plurality of groups represented by corresponding $R^{77}$, $R^{78}$, $R^{79}$, $R^{80}$, $R^{81}$ or $R^{82}$ may be the same with or different from each other and may form a ring by forming a bond between each other; and $L^2$ represents a single bond, —O—, —S—, —N(R)— or an arylene group, R representing an alkyl group or a substituted or unsubstituted aryl group.

In the above general formulae (5-a) and (5-b), preferable examples of the groups represented by $R^{71}$ to $R^{84}$ include alkyl groups having 1 to 6 carbon atoms, cycloalkyl groups having 3 to 6 carbon atoms, aryl groups having 5 to 18 carbon atoms, alkoxyl groups having 1 to 6 carbon atoms, aryloxy groups having 5 to 18 carbon atoms, amino groups substituted with an aryl group having 5 to 16 carbon atoms and heterocyclic groups such as triazole group, oxadiazole group, quinoxaline group, furanyl group and thienyl group.

In the group represented by —N(R)— which is represented by $L^1$ or $L^2$, preferable examples of the group represented by R include alkyl groups having 1 to 6 carbon atoms and aryl groups having 5 to 18 carbon atoms.

Preferable examples of the anthracene derivative represented by general formula (6) include anthracene derivatives represented by general formula (6-a):

$$A^{3'}\text{-An-}A^{4'} \quad (6\text{-a})$$

wherein An represents a substituted or unsubstituted divalent anthracene residue group and $A^{3'}$ and $A^{4'}$ each independently represent a monovalent residue group derived from biphenyl, fluoranthene, naphthalene, phenanthrene, anthracene, pyrene, perylene, coronene, chrysene, picene, fluorene, terphenyl, diphenylanthracene, biphenyl, an N-alkylcarbazole, an N-arylcarbazole, triphenylene, rubicene, benzoanthracene or dibenzo-anthracene, which may be substituted or unsubstituted; or a group represented by general formula (6-b):

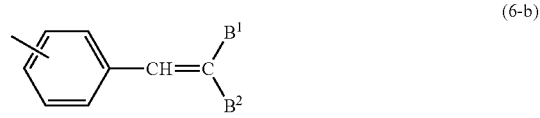

(6-b)

wherein $B^1$ and $B^2$ each represent a substituted or unsubstituted phenyl group, naphthyl group, biphenyl group, terphenyl group or anthryl group.

Examples of the substituent in the groups represented by An, $A^{3'}$ and $A^{4'}$ include the groups described as the examples of the substituents in general formulae (5) and (6).

In the present invention, the anthracene derivative may be used singly or in combination of two or more.

The electron transporting compound used in the organic EL device of the present invention may be a cyclic derivative having Si such as silacyclopentadiene derivatives.

In the organic EL device of the present invention, it is preferable that the thickness of the layer of the organic light emitting medium is in the range of 5 to 200 nm and more preferably in the range of 10 to 100 nm since the voltage applied to the device can be remarkably decreased.

By using the combination of component (A) and component (B) for the layer of the organic light emitting medium, crystallization in the layer of the organic light emitting medium is suppressed and the layer of the organic light emitting medium becomes more amorphous. Therefore, stability is enhanced and heat resistance is improved. As the compound of component (B), compounds having a glass transition temperature of 110° C. or higher are preferable. By mixing the compound having a glass transition temperature of 110° C. or higher, the glass transition temperature of the layer of the organic light emitting medium can be raised to 110° C. or higher and a heat resistance in storage of 500 hours or longer at 85° C. can be obtained.

The chromaticity and the peak wavelength in the spectrum of the emitted light can be controlled by adjusting the relative amounts of component (A) and component (B). By increasing the relative amount of component (A), the peak wavelength in the spectrum of the emitted light shifts to longer wavelengths and the x-coordinate of the chromaticity coordinates increases. This phenomenon takes place because the peak wavelength in the spectrum of emitted light due to component (A) is in the region of longer wave lengths.

It is preferable that component (A) and component (B) are mixed in amounts such that the ratio of the amount by weight of component (A) to the amount by weight of component (B) is in the range of 8:92 to 92:8. When the amount of component (A) is less than 8% by weight, it becomes difficult that holes are transported to the area of recombination through the lowest occupied orbital of the hole transporting compound. This phenomenon can be found from the increase in the voltage applied to the device when the amount of component (A) is less than 8%. When the amount of component (A) exceeds 92% by weight, it becomes difficult that electrons are transported to the area of recombination through the lowest unoccupied orbital of the electron transporting compound. It is preferable that the ratio of the amount by weight of component (A) to the amount by weight of component (B) is in the range of 15:60 to 85:40 since the device has a longer life.

In the organic EL device of the present invention, it is preferable that the mixed layer in the layer of the organic light emitting medium further comprises (C) a fluorescent compound since heat resistance and the efficiency of light emission are further improved. It is preferable that the mixed layer of the organic light emitting medium comprises components (A), (B) and (C) in amounts such that a ratio of a total amount by weight of component (A) and component (B) to an amount by weight of component (C) is in the range of 100:1 to 10:1.

In the organic EL device of the present invention, it is preferable that various intermediate layers are disposed between the electrodes and the layer of the organic light emitting medium. Examples of the intermediate layer include a hole injecting layer, a hole transporting layer, an electron injecting layer and an electron transporting layer. It is known that various organic and inorganic compounds can be used for these layers.

Typical examples of the construction of the organic EL device include:

An anode/a layer of an organic light emitting medium/a cathode;

An anode/a hole injecting layer/a layer of an organic light emitting medium/a cathode;

An anode/a layer of an organic light emitting medium/an electron injecting layer/a cathode;

An anode/a hole injecting layer/a layer of an organic light emitting medium/an electron injecting layer/a cathode;

An anode/an organic semiconductor layer/a layer of an organic light emitting medium/a cathode;

An anode/an organic semiconductor layer/an electron barrier layer/a layer of an organic light emitting medium/a cathode;

An anode/an organic semiconductor layer/a layer of an organic light emitting medium/an adhesion improving layer/a cathode; and An anode/a hole injecting layer/a hole transporting layer/a layer of an organic light emitting medium/an electron injecting layer/a cathode.

However, the construction of the organic EL device is not limited to the above examples.

In general, the organic EL device is prepared on a substrate which transmits light. The substrate which transmits light is the substrate which supports the organic EL device. It is preferable that the substrate which transmits light has a transmittance of light of 50% or greater and more preferably 80% or greater in the visible region of 400 to 700 nm. It is also preferable that a flat and smooth substrate is used.

As the substrate which transmits light, for example, glass plates and synthetic resin plates are advantageously used. Specific examples of the glass plates include plates made of soda ash glass, glass containing barium and strontium, lead glass, aluminosilicate glass, borosilicate glass, barium borosilicate glass and quartz. Specific examples of the synthetic resin plates include plates made of polycarbonate resins, acrylic resins, polyethylene terephthalate resins, polyether sulfide resins and polysulfone resins.

As the anode, an electrode made of a material such as a metal, an alloy, a conductive compound and a mixture of these materials which has a great work function (4 eV or more) is preferably used. Specific examples of the material for the anode include metals such as Au and conductive materials such as CuI, ITO (indium tin oxide), $SnO_2$, ZnO and In—Zn—O. The anode can be prepared by forming a thin film of the electrode material described above in accordance with a process such as the vapor deposition process and the sputtering process. When the light emitted from the light emitting layer is obtained through the anode, it is preferable that the anode has a transmittance of the emitted light greater than 10%. It is also preferable that the sheet resistivity of the anode is several hundred Ω/□ or smaller. The thickness of the anode is, in general, selected in the range of 10 nm to 1 μm and preferably in the range of 10 to 200 nm although the preferable range may be different depending on the used material.

As the cathode, an electrode made of a material such as a metal, an alloy, a conductive compound and a mixture of these materials which has a small work function (4 eV or smaller) is used. Specific examples of the material for the cathode include sodium, sodium-potassium alloys, magnesium, lithium, magnesium-silver alloys, aluminum/aluminum oxide, $Al/Li_2O$, $Al/LiO_2$, Al/LiF, aluminum-lithium alloys, indium and rare earth metals. The cathode can be prepared by forming a thin film of the material described above in accordance with a process such as the vapor deposition process and the sputtering process. When the light emitted from the layer of the organic light emitting medium is obtained through the cathode, it is preferable that the cathode has a transmittance of the emitted light greater than 10%. It is also preferable that the sheet resistivity of the cathode is several hundred Ω/□ or smaller. The thickness of the cathode is, in general, selected in the range of 10 nm to 1 μm and preferably in the range of 50 to 200 nm although the preferable range may be different depending on the used material.

In the organic EL device of the present invention, it is preferable that a layer of a chalcogenide, a metal halide or a metal oxide (this layer may occasionally be referred to as a surface layer) is disposed on the surface of at least one of the pair of electrodes prepared as described above. Specifically, it is preferable that a layer of a chalcogenide (including an oxide) of a metal such as silicon and aluminum is disposed on the surface of the anode at the side of the layer of the organic light emitting medium and a layer of a metal halide or a metal oxide is disposed on the surface of the cathode at the side of the layer of the organic light emitting medium. Due to the above layers, holes or electrons are more easily injected into the light emitting medium and the device can be driven at a lower voltage.

Preferable examples of the chalcogenide include $SiO_x$ ($1 \leq x \leq 2$), $Al_x$ ($1 \leq x \leq 1.5$), SiON and SiAlON. Preferable examples of the metal halide include LiF, $MgF_2$, $CaF_2$ and fluorides of rare earth metals. Preferable examples of the metal oxide include $Cs_2O$, $Li_2O$, MgO, SrO, BaO and CaO.

In the organic EL device of the present invention, the electron transporting property and the hole transporting property of the layer of the organic light emitting medium are simultaneously improved by suitably adjusting the relative amounts of component (A) and component (B) described above and the above intermediate layers such as the hole injecting layer, the hole transporting layer and the electron injecting layer can be omitted. In this case, it is preferable that the surface layer described above is disposed.

In the organic EL device of the present invention, it is preferable that a mixed region of an electron transfer compound and a reducing dopant or a mixed region of a hole transfer compound and an oxidizing dopant is disposed on the surface of at least one of the pair of electrodes prepared as described above. Due to the mixed region disposed on the surface of the pair of electrodes, the electron transfer compound is reduced to form an anion. Injection and transportation of electrons from the mixed region into the light emitting medium can be facilitated and the device can be driven at a lower voltage. The hole transfer compound is oxidized to form a cation and injection and transportation of holes from the mixed region into the light emitting medium is facilitated. Preferable examples of the oxidizing dopant include various types of Lewis acid and acceptor compounds. Preferable examples of the reducing dopant include alkali metals, compounds of alkali metals, alkaline earth metals, rare earth metals and compounds of these metals.

In the organic EL device of the present invention, the layer of the organic light emitting medium has the following functions:

(1) The injecting function: the function of injecting holes from the anode or the hole injecting layer and injecting electrons from the cathode or the electron injecting layer when an electric field is applied;
(2) The transporting function: the function of transporting injected charges (electrons and holes) by the force of the electric field; and
(3) The light emitting function: the function of providing the field for recombination of electrons and holes and leading the recombination to the emission of light.

In the organic EL device of the present invention, it is preferable that the work function WF of the anode which injects holes into the layer of the organic light emitting medium and the ionization energy of the hole transporting compound IP1 satisfy a relation: IP1−WF≦0.2 eV. When the above relation is satisfied, hole injection from the anode into the light emitting medium is increased and the hole injection layer can be omitted. Therefore, the device can be simplified and the production cost of the device can be reduced.

As the process for forming the layer of the organic light emitting medium, a conventional process such as the vapor deposition process, the spin coating process and the Langmuir-Blodgett process (the LB process) can be used. It is particularly preferable that the layer of the organic light emitting medium is a molecular deposit film. The molecular deposit film is a thin film formed by deposition of a material compound in the gas phase or a thin film formed by solidification of a material compound in a solution or in the liquid phase. In general, the molecular deposit film can be distinguished from the thin film formed in accordance with the LB process (the molecular accumulation film) based on the differences in the aggregation structure and higher order structures and functional differences caused by these structural differences.

As disclosed in Japanese Patent Application Laid-Open No. Showa 57(1982)-51781, the layer of the organic light emitting medium can also be formed by dissolving a binder such as a resin and the material compounds into a solvent to prepare a solution, followed by forming a thin film from the prepared solution in accordance with the spin coating process or the like.

In the present invention, where desired, conventional light emitting media other than component (A), component (B) and component (C) described above may be comprised in the layer of the organic light emitting medium or a layer of an organic light emitting medium comprising other conventional light emitting media may be laminated to the layer of the organic light emitting medium comprising the compounds described in the present invention as long as the object of the present invention is not adversely affected.

The hole injecting layer and the hole transporting layer are layers which help injection of holes into the layer of the organic light emitting medium and transport the holes to the light emitting region. The layers exhibit a great mobility of holes and, in general, have an ionization energy as small as 5.5 eV or smaller. For the hole injecting layer and the hole transporting layer, a material which transports holes to the layer of the organic light emitting medium at a small electric field strength is preferable. A material which exhibits, for example, a mobility of holes of at least $10^{-6}$ cm$^2$/V·sec under application of an electric field of $10^4$ to $10^6$ V/cm is more preferable. A material can be selected from materials which are conventionally used as the charge transporting material of holes in photoconductive materials and conventional materials which are used for the hole injecting layer in organic EL devices.

To form the hole injecting layer or the hole transporting layer, a thin film may be formed from a material substance for the hole injecting layer or the hole transporting layer, respectively, in accordance with a conventional process such as the vacuum vapor deposition process, the spin coating process, the casting process and the LB process. The thickness of the hole injecting layer and the hole transporting layer is not particularly limited. In general, the thickness is 5 nm to 5 μm.

The electron injection layer is a layer which helps injection of electrons into the layer of the organic light emitting medium and exhibits a great mobility of electrons. The adhesion improving layer is a layer made of a material exhibiting excellent adhesion with the cathode in the electron injecting layer. As the material for the electron injecting layer, metal complexes of 8-hydroxyquinoline and derivatives thereof are preferably used. Specific examples of the metal complex of 8-hydroxyquinoline and derivatives thereof include metal chelates of oxinoid compounds including chelates of oxine (in general, 8-quinolinol or 8-hydroxyquinoline). For example, tris(8-quinolinol)aluminum can be used as the electron injecting material.

To prepare the organic EL device of the present invention, for example, the anode, the layer of the organic light emitting medium and, where necessary, the hole injecting layer and the electron injecting layer are formed in accordance with the above process using the above materials and the cathode is formed in the last step. The organic EL device may be prepared by forming the above layers in the order reverse to that described above, i.e., the cathode being formed in the first step and the anode in the last step.

An embodiment of the process for preparing an organic EL device having a construction in which an anode, a hole injecting layer, a layer of the organic light emitting medium, an electron injecting layer and a cathode are disposed successively on a substrate which transmits light will be described in the following.

On a suitable substrate which transmits light, a thin film made of a material for the anode is formed in accordance with the vapor deposition process or the sputtering process so that the thickness of the formed thin film is 1 μm or smaller and preferably in the range of 10 to 200 nm. The formed thin film is used as the anode. Then, a hole injecting layer is formed on the anode. The hole injecting layer can be formed in accordance with the vacuum vapor deposition process, the spin coating process, the casting process or the LB process, as described above. The vacuum vapor deposition process is preferable because a uniform film can be easily obtained and the possibility of formation of pin holes is small. When the hole injecting layer is formed in accordance with the vacuum vapor deposition process, in general, it is preferable that the conditions are suitably selected in the following ranges: the temperature of the source of the deposition: 50 to 450° C.; the vacuum: $10^{-7}$ to $10^{-3}$ Torr; the rate of deposition: 0.01 to 50 nm/second; the temperature of the substrate: −50 to 300° C. and the thickness of the film: 5 nm to 5 μm; although the conditions of the vacuum vapor deposition are different depending on the used compound (the material for the hole injecting layer) and the crystal structure and the recombination structure of the hole injecting layer to be formed.

Then, the layer of the organic light emitting medium is formed on the hole injecting layer formed above. Using the organic light emitting medium described in the present invention, a thin film of the organic light emitting medium can be formed in accordance with the vacuum vapor deposition process, the sputtering process, the spin coating process or the casting process and the formed thin film is used as the layer of the organic light emitting medium. The vacuum vapor deposition process is preferable because a uniform film can be easily obtained and the possibility of formation of pin holes is small. When the layer of the organic light emitting medium is formed in accordance with the vacuum vapor deposition process, in general, the conditions of the vacuum vapor deposition process can be selected in the same ranges as those described for the vacuum vapor deposition of the hole injecting layer although the conditions are different depending on the used compound. It is preferable that the thickness is in the range of 10 to 40 nm.

An electron injecting layer is formed on the layer of the organic light emitting medium formed above. Similarly to the hole injecting layer and the layer of the organic light emitting medium, it is preferable that the electron injecting layer is formed in accordance with the vacuum vapor deposition process since a uniform film must be obtained. The conditions of the vacuum vapor deposition can be selected in the same ranges as those described for the vacuum vapor deposition of the hole injecting layer and the layer of the organic light emitting medium.

A cathode is formed on the electron injecting layer formed above in the last step and an organic EL device can be obtained. The cathode is made of a metal and can be formed in accordance with the vacuum vapor deposition process or the sputtering process. It is preferable that the vacuum vapor deposition process is used in order to prevent formation of damages on the lower organic layers during the formation of the film.

In the above preparation of the organic EL device, it is preferable that the above layers from the anode to the cathode are formed successively while the preparation system is kept in a vacuum after being evacuated.

The organic EL device which can be prepared as described above emits light when a direct voltage of 3 to 40 V is applied in the condition that the anode is connected to a positive electrode (+) and the cathode is connected to a negative electrode (−). When the connection is reversed, no electric current is observed and no light is emitted at all. When an alternating voltage is applied to the organic EL device, light emission is observed only in the condition that the polarity of the anode is positive and the polarity of the cathode is negative. When an alternating voltage is applied to the organic EL device, any type of wave shape can be used.

The present invention will be described more specifically with reference to examples in the following. However, the present invention is not limited to the examples.

EXAMPLE 1

The Ratio of Amounts by Weight: 40:20

On a glass plate having a size of 25×75×1.1 mm, a transparent electrode made of indium tin oxide and having a thickness of 120 nm was formed. After the glass substrate was cleaned by irradiation with ultraviolet light and exposure to ozone, the glass substrate was placed in a vacuum vapor deposition apparatus.

In the first step, TPD106 expressed by the following formula:

was vapor deposited so that a layer having a thickness of 60 nm was formed. Then, TPD78 expressed by the following formula:

TPD78

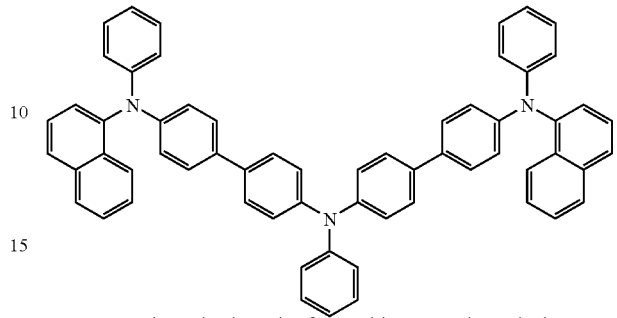

was vapor deposited on the formed layer so that a hole transporting layer having a thickness of 20 nm was formed on the layer of TPD106. Then, DC5 expressed by the following formula:

DC5: a mixture of isomers in a ratio of amounts of 70/30.

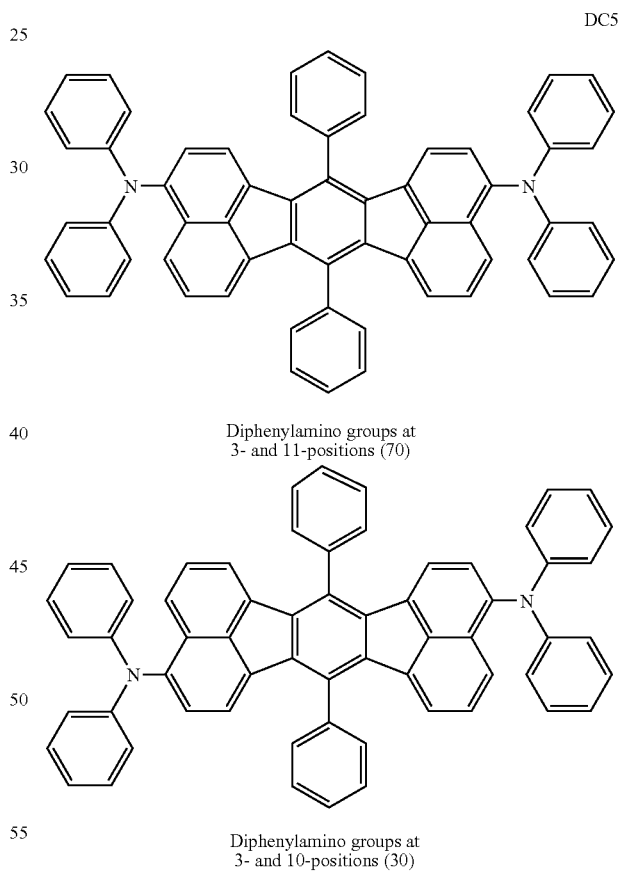

DC5

Diphenylamino groups at
3- and 11-positions (70)

Diphenylamino groups at
3- and 10-positions (30)

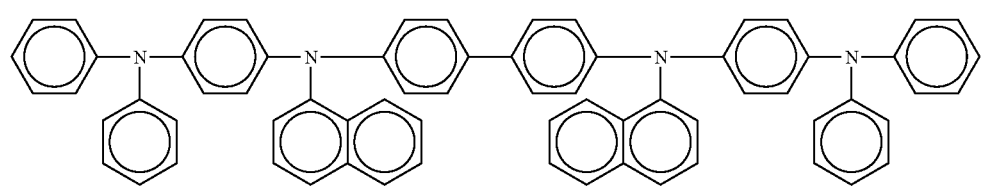

TPD106 as the hole transporting compound and Alq (an Al complex of 8-hydroxyquinoline) as the electron transporting compound were simultaneously vapor deposited on the formed layers in amounts such that the ratio of the amount by weight of DC5 to the amount by weight of Alq was 67.7:32.3 and a layer of an organic light emitting medium having a thickness of 40 nm was formed. Then, Alq was vapor deposited so that a layer having a thickness of 20 nm was formed on the layer formed above as the electron injecting layer.

The energy gap of DC5 (Eg1) is 2.57 eV and smaller than the energy gap (Eg2) of Alq which is 2.7 eV. The ionization energy of DC5 (IP1) is 5.6 eV and smaller than the ionization energy (IP2) of Alq which is 5.7 eV. The electron affinity of DC5 (Af1) is 3.0 eV and the same as the electron affinity (Af2) of Alq which is 3.0 eV.

Then, LiF which was an alkali metal halide was vapor deposited so that a layer having a thickness of 0.3 nm was formed on the above layers and aluminum was vapor deposited so that a layer having a thickness of 100 nm was formed on the layer of LiF. The layers of LiF and Al worked as the cathode. An organic EL device was prepared as described above.

The prepared organic EL device was tested by passing an electric current. Reddish orange light emission having a luminance of 110 cd/m$^2$ was obtained at a voltage of 4.5 V and a current density of 2.46 mA/cm$^2$. The chromaticity coordinates were (0.6039, 0.3931) and the efficiency of light emission was 4.47 cd/A. The device was tested by continuously passing a current constantly at an initial luminance of 500 cd/M$^2$ and the half-life time was found to be as long as 3,120 hours.

EXAMPLE 2

An organic EL device was prepared in accordance with the same procedures as those conducted in Example 1 except that DC5 and Alq were used for forming the layer of an organic light emitting medium in amounts such that the ratio of the amount by weight of DC5 to the amount by weight of Alq was 44.4:55.6.

The prepared organic EL device was tested by passing an electric current. Red light emission having a luminance of 109 cd/M$^2$ was obtained at a voltage of 4.0 V and a current density of 2.71 mA/cm$^2$. The chromaticity coordinates were (0.5886, 0.4072) and the efficiency of light emission was 4.02 cd/A. The device was tested by continuously passing a current constantly at an initial luminance of 500 cd/m$^2$ and the half-life time was found to be as long as 3,760 hours.

EXAMPLE 3

An organic EL device was prepared in accordance with the same procedures as those conducted in Example 1 except that DC5 and Alq were used for forming the layer of an organic light emitting medium in amounts such that the ratio of the amount by weight of DC5 to the amount by weight of Alq was 28.6:71.4.

The prepared organic EL device was tested by passing an electric current. Red light emission having a luminance of 124 cd/m$^2$ was obtained at a voltage of 4.0 V and a current density of 2.96 mA/cm$^2$. The chromaticity coordinates were (0.5741, 0.4228) and the efficiency of light emission was 4.19 cd/A. The device was tested by continuously passing a current constantly at an initial luminance of 500 cd/m$^2$ and the half-life time was found to be as long as 4,100 hours.

EXAMPLE 4

An organic EL device was prepared in accordance with the same procedures as those conducted in Example 1 except that DC5 and Alq were used for forming the layer of an organic light emitting medium in amounts such that the ratio of the amount by weight of DC5 to the amount by weight of Alq was 12:88.

The prepared organic EL device was tested by passing an electric current. Red light emission having a luminance of 135 cd/m$^2$ was obtained at a voltage of 4.5 V and a current density of 3.0 mA/cm$^2$. The chromaticity coordinates were (0.5652, 0.4352) and the efficiency of light emission was 4.50 cd/A. The device was tested by continuously passing a current constantly at an initial luminance of 500 cd/m$^2$ and the half-life time was found to be as long as 2,900 hours.

COMPARATIVE EXAMPLE 1

An organic EL device was prepared in accordance with the same procedures as those conducted in Example 1 except that DC5 and Alq were used for forming the layer of an organic light emitting medium in amounts such that the ratio of the amount by weight of DC5 to the amount by weight of Alq was 2.4:97.6.

The prepared organic EL device was tested by passing an electric current. A current of 1.30 mA/cm$^2$ was observed at a voltage of 6 V. The applied voltage was higher than those for the organic EL devices of Examples 1 to 4. The luminance was 173 cd/m$^2$, the chromaticity coordinates were (0.5416, 0.4550) and the efficiency of light emission was 8.78 cd/A. The purity of red light was insufficient in comparison with those in Examples 1 to 4. The device was tested by continuously passing a current constantly at an initial luminance of 500 cd/m$^2$ and the half-life time was found to be 970 hours. The half-life was much shorter than those in Examples 1 to 4.

COMPARATIVE EXAMPLE 2

An organic EL device was prepared in accordance with the same procedures as those conducted in Example 1 except that DC5 and Alq were used for forming the layer of an organic light emitting medium in amounts such that the ratio of the amount by weight of DC5 to the amount by weight of Alq was 4.8:95.2.

Using the prepared organic EL device, the voltage showing the same luminance as that of the device of Comparative Example 1 was measured and found to be 7.3 V. The voltage was higher than that of the device of Comparative Example 1.

COMPARATIVE EXAMPLE 3

An organic EL device was prepared in accordance with the same procedures as those conducted in Example 1 except that DC5 and Alq were used for forming the layer of an organic light emitting medium in amounts such that the ratio of the amount by weight of DC5 to the amount by weight of Alq was 9.1:90.9.

Using the prepared organic EL device, the voltage showing the same luminance as that of the device of Comparative Example 1 was measured and found to be 7.1 V. The voltage was higher than that of the device of Comparative Example 1.

It can be concluded from the results in Comparative Examples 2 and 3 that Alq worked as the trap for holes transported from DC5 and the applied voltage increased. In contrast, devices in which DC5 was added in an amount exceeding 10% by weight showed a remarkable decrease in the voltage. It can be concluded that the voltage decreased since DC5 worked as a compound having the hole transporting property and holes could be transported at a high efficiency.

COMPARATIVE EXAMPLE 4

An organic EL device was prepared in accordance with the same procedures as those conducted in Example 1 except that TPD (N,N'-bis(m-methylphenyl)-N,N'-diphenyl-1,1'-biphenyl-4,4'-diamine) having an energy gap (Eg1) of 3.0 eV was used in place of DC5.

The prepared organic EL device was tested by passing an electric current. Green light emission having a luminance of 56 cd/m² was obtained at a voltage of 5.6 V and a current density of 2.8 mA/cm². The efficiency of light emission was 2.0 cd/A. The device was tested by continuously passing a current constantly at an initial luminance of 500 cd/m² and the half-life time was found to be as short as 130 hours. Therefore, the device in Example 1 was superior to the device in Comparative Example 4 with respect to both of the efficiency of light emission and the life. Thus, it is shown that an organic EL device in the condition of Eg1≧Eg2 has a problem in practical applications.

INDUSTRIAL APPLICABILITY

As described in detail in the above, in accordance with the present invention, the organic EL device having a longer life and emitting light at a higher efficiency than those of conventional EL devices can be obtained. The organic EL device of the present invention can be advantageously used, for example, for displays of information instruments.

What is claimed is:

1. An organic electroluminescence device comprising a pair of electrodes and a layer of an organic light emitting medium between the pair of electrodes, wherein the layer of an organic light emitting medium comprises a mixed layer consisting essentially of: (A) at least one compound selected from hole transporting compounds, and (B) at least one compound selected from electron transporting compounds in amounts such that a ratio of an amount of component (A) to an amount of component (B) is in a range of 8:92 to 92:8 and the hole transporting compound and the electron transporting compound satisfy the following formulae 1 to 4 or formulae 1, 2, 5 and 6:

$$Eg1<Eg2 \quad (1)$$

wherein Eg1 is an energy gap of the hole transporting compound and Eg2 is an energy gap of the electron transporting compound;

$$IP1 \leq IP2 \quad (2)$$

wherein IP1 is an ionization energy of the hole transporting compound and IP2 is an ionization energy of the electron transporting compound;

$$Af1 \leq Af2 \quad (3)$$

wherein Af1 is an electron affinity of the hole transporting compound and Af2 is an electron affinity of the electron transporting compound;

$$\Delta Ev \geq \Delta Ec \quad (4)$$

wherein ΔEv is IP2−IP1 and ΔEc is Af2−Af1;

$$Af1>Af2 \quad (5)$$

$$\Delta Ev \geq \Delta Ec' \quad (6)$$

wherein ΔEc' is Af1−Af2, and
the hole transporting compound is an aromatic amine having a condensed cyclic structure represented by the following general formula (1):

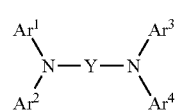

(1)

wherein $Ar^1$ to $Ar^4$ each independently represents a substituted or unsubstituted aromatic hydrocarbon group having 6 to 40 carbon atoms or a substituted or unsubstituted aromatic heterocyclic group having 3 to 40 carbon atoms, Y represents a substituted or unsubstituted aromatic residue group having 2 to 60 carbon atoms, at least one of the groups represented by $Ar^1$ to $Ar^4$ and Y has a condensed cyclic group having 3 or more rings and a substituent in the groups represented by $Ar^1$ to $Ar^4$ and Y may form a ring with two groups selected from the groups represented by $Ar^1$ to $Ar^4$ and Y.

2. An organic electroluminescence device according to claim 1, wherein the electron transporting compound is a heterocyclic compound having a nitrogen atom or a complex having a nitrogen atom.

3. An organic electroluminescence device according to claim 2, wherein the complex having a nitrogen atom is represented by following general formula (3):

$$M-A_mB_n \quad (3)$$

wherein M represents a monovalent to trivalent metal, A represents a ligand having a nitrogen atom, B represents a ligand having no nitrogen atoms, m represents an integer of 1 to 4, n represents an integer of 0 to 2 and integers represented by m and n satisfy m+n≦4.

4. An organic electroluminescence device according to claim 3, wherein the ligand having a nitrogen atom is represented by following general formula (4):

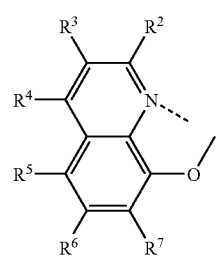

(4)

wherein $R^2$ to $R^7$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 3 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 40 carbon atoms or carboxyl group and two groups selected from the groups represented by $R^2$ to $R^7$ may form a ring.

5. An organic electroluminescence device according to claim 1, wherein the electron transporting compound is represented by following general formula (5):

$$A^1\text{-}L\text{-}A^2 \quad (5)$$

wherein $A^1$ and $A^2$ each independently represent a substituted or unsubstituted monophenylanthryl group or a substituted or unsubstituted diphenylanthryl group and may represent a same group or different groups and L represents a single bond or a divalent bonding group; or by following general formula (6):

$$A^3\text{-}An\text{-}A^4 \quad (6)$$

wherein An represents a substituted or unsubstituted anthracene residue group and $A^3$ and $A^4$ each independently represent a substituted or unsubstituted monovalent condensed aromatic cyclic group having 10 to 40 carbon atoms or a substituted or unsubstituted aryl group having no condensed cyclic structures and having 12 to 40 carbon atoms and may represent a same group or different groups.

6. An organic electroluminescence device according to claim 1, wherein the electron transporting compound is a cyclic derivative having Si.

7. An organic electroluminescence device according to claim 1, wherein the mixed layer in the layer of an organic light emitting medium further comprises (C) a fluorescent compound.

8. An organic electroluminescence device according to claim 7, wherein the layer of an organic light emitting medium comprises component (A), component (B) and component (C) in amounts such that a ratio of a total amount by weight of component (A) and component (B) to an amount by weight of component (C) is in a range of 100:1 to 10:1.

9. An organic electroluminescence device according to claim 1, wherein a layer of a chalcogenide, a metal halide or a metal oxide is disposed on a surface of at least one of the pair of electrodes.

10. An organic electroluminescence device according to claim 1, wherein a mixed region of a reducing dopant and the electron transporting compound or a mixed region of an oxidizing dopant and the hole transporting compound is disposed on a surface of at least one of the pair of electrodes.

11. An organic electroluminescence device according to claim 1, wherein a work function WF of an anode which injects holes into the layer of an organic light emitting medium and an ionization energy of the hole transporting compound IP1 satisfy a relation:

$$IP1-WF \leq 0.2 \text{ eV}.$$

12. The organic electroluminescence device according to claim 1, wherein the weight ratio of the component (A) and the component (B) is in a range of 12:88 to 67.7:32.3.

13. The organic electroluminescence device according to claim 1, wherein the weight ratio of the component (A) and the component (B) is in a range of 12:88 to 44.4:55.6.

14. The organic electroluminescence device according to claim 1, wherein the weight ratio of the component (A) and the component (B) is in a range of 28.6:71.4 to 44.4:5 5.6.

15. The organic electroluminescence device according to claim 1, wherein the layer of an organic light emitting medium is located between a hole injecting layer and an electron injecting layer.

16. The organic electroluminescence device according to claim 4, wherein the ligand having a nitrogen atom represented by the formula (4) is selected from the group consisting of 8-quinolinolato, benzo(f)-8-quinolinolato, 2-methyl-8-quinolinolato, 5 -methyl-8-quinolinolato, 5-chloro-8-quinolinolato, 5,7-dichloro-8-8-quinolinolato, 5,7-dibromo-8-hydroxyquinolinolato, (8-hydroxy-5-quinolinyl)methane, 2,4-dimethyl-8-quinolinolato, 2-methyl -4-ethyl-8-quinolinolato, 2-methyl-4-methoxy-8-quinolinolato, 2-methyl-5-cyano-8-quinolinolato, 2-methyl-6-trifluoromethyl-8-quinolinolato, and 2-methyl-5-trifluoromethyl-8-quinolinolato.

* * * * *